US012755926B2

(12) United States Patent
Imai et al.

(10) Patent No.: US 12,755,926 B2
(45) Date of Patent: Oct. 6, 2026

(54) SAMPLE IMAGE OBSERVATION DEVICE AND METHOD

(71) Applicant: Hitachi High-Tech Corporation, Tokyo (JP)

(72) Inventors: Yuta Imai, Tokyo (JP); Daisuke Bizen, Tokyo (JP); Junichi Katane, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 422 days.

(21) Appl. No.: 18/556,927

(22) PCT Filed: Jun. 4, 2021

(86) PCT No.: PCT/JP2021/021390

§ 371 (c)(1),
(2) Date: Oct. 24, 2023

(87) PCT Pub. No.: WO2022/254698

PCT Pub. Date: Dec. 8, 2022

(65) Prior Publication Data

US 2024/0222065 A1 Jul. 4, 2024

(51) Int. Cl.
*H01J 37/22* (2006.01)
*H01J 37/28* (2006.01)

(52) U.S. Cl.
CPC ............ *H01J 37/224* (2013.01); *H01J 37/28* (2013.01)

(58) Field of Classification Search
CPC ................................ H01J 37/224; H01J 37/28
See application file for complete search history.

(56) References Cited

U.S. PATENT DOCUMENTS 12,406,826 B2 * 9/2025 Bizen .................... H01J 37/228
2012/0153145 A1 6/2012 Cheng et al.
(Continued)

FOREIGN PATENT DOCUMENTS

JP S63-100362 A 5/1988
JP 2019-525408 A 9/2019
(Continued)

OTHER PUBLICATIONS

International Search Report, PCT/JP2021/021390, Jul. 20, 2021, 2 pgs.
(Continued)

*Primary Examiner* — Nicole M Ippolito
(74) *Attorney, Agent, or Firm* — Volpe Koenig

(57) ABSTRACT

To provide a sample image observation device and a method that restore an image based on a sparsely sampled image and that can improve observation throughput and usability by maintaining a restored image quality constant regardless of a change in an observation condition. In a sample image observation device that irradiates a part of an observation area of the sample 19 with an electron beam and restores an image including a pixel not irradiated with the electron beam, the control system 22 includes a storage unit configured to store a correlation between an irradiation condition of irradiating the observation area of the sample with the electron beam and an observation condition of the sample, a control unit configured to synchronize an irradiation proportion of the electron beam with the observation condition based on the correlation, and an input unit configured to input sample information on the sample.

15 Claims, 9 Drawing Sheets

(56) References Cited

U.S. PATENT DOCUMENTS

| | | | |
|---|---|---|---|
| 2015/0254393 | A1 | 9/2015 | Fujimura |
| 2017/0243717 | A1 | 8/2017 | Kruit |
| 2018/0025887 | A1 | 1/2018 | Kovarik et al. |

FOREIGN PATENT DOCUMENTS

| | | | |
|---|---|---|---|
| JP | 2021-085776 | A | 6/2021 |
| TW | 201539117 | A | 10/2015 |
| TW | 201614706 | A | 4/2016 |
| WO | 2011/016208 | A1 | 2/2011 |

OTHER PUBLICATIONS

Taiwan Office Action, TW Patent Application No. 111118906, May 16, 2023, 9 pgs.

* cited by examiner

[FIG. 1]
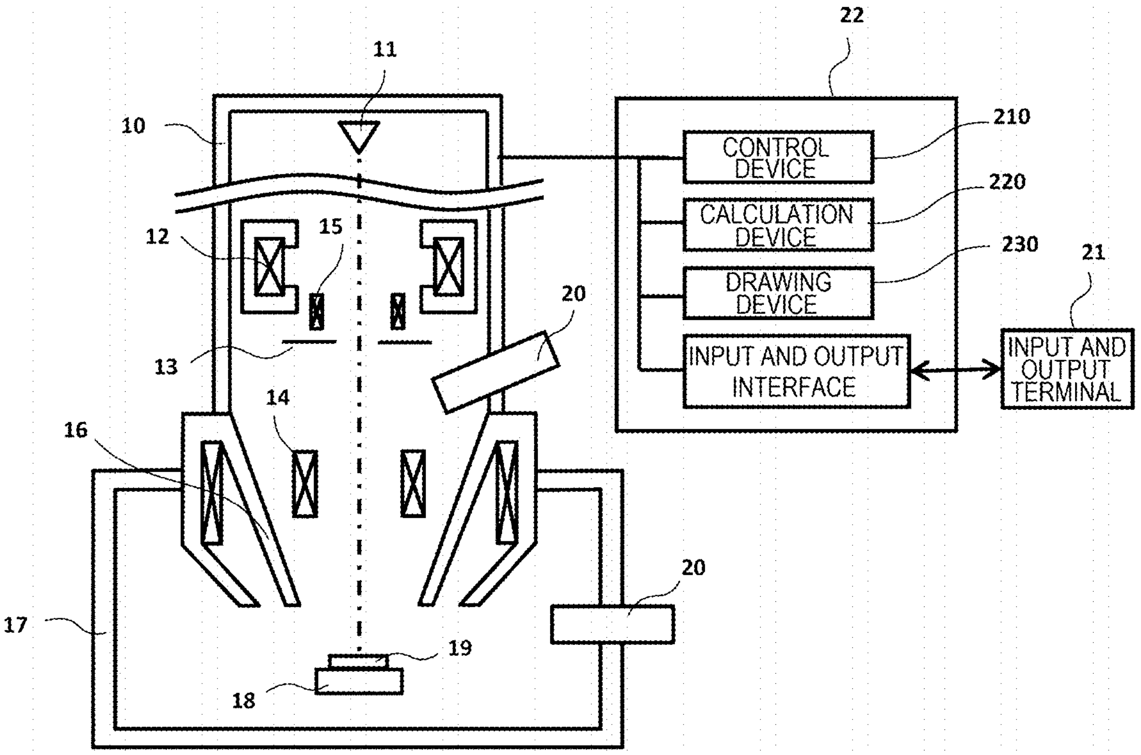
[FIG. 2]
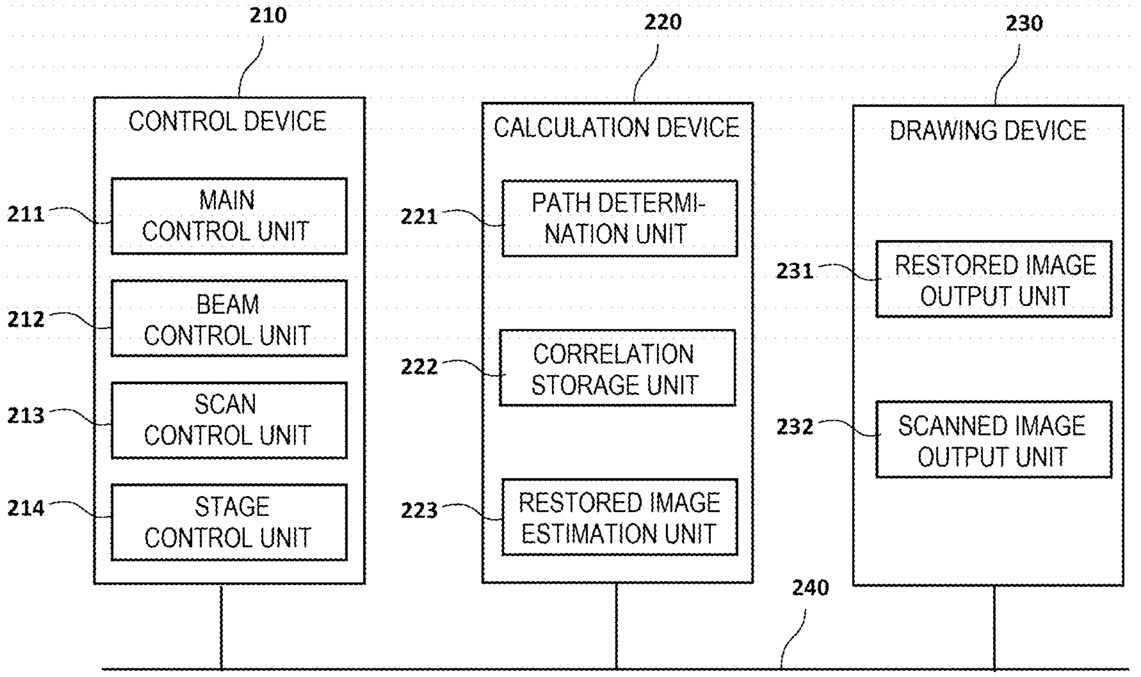

[FIG. 3]
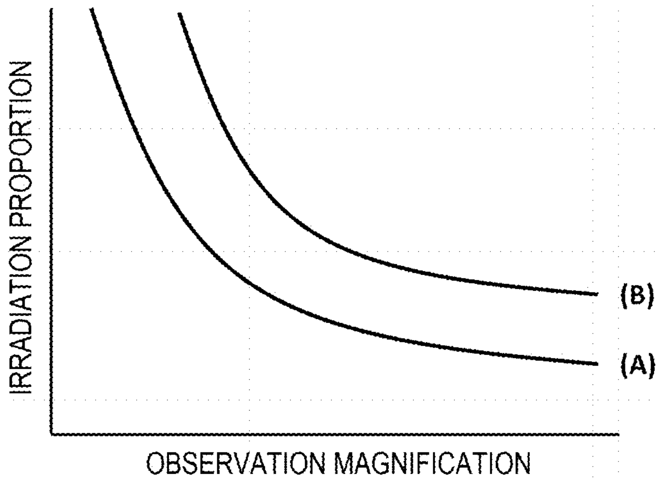
[FIG. 4]
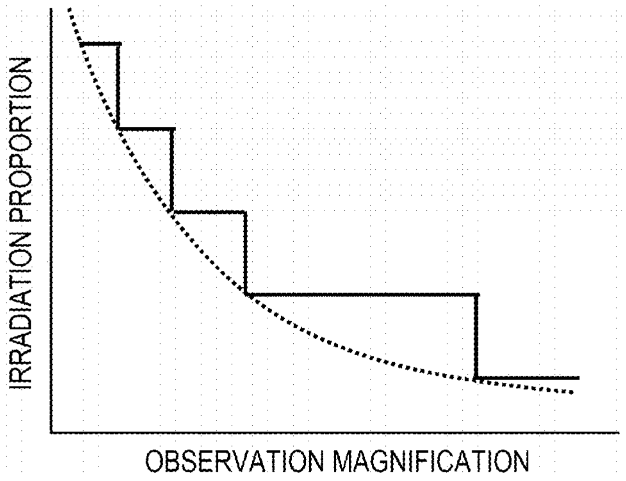

[FIG. 5]
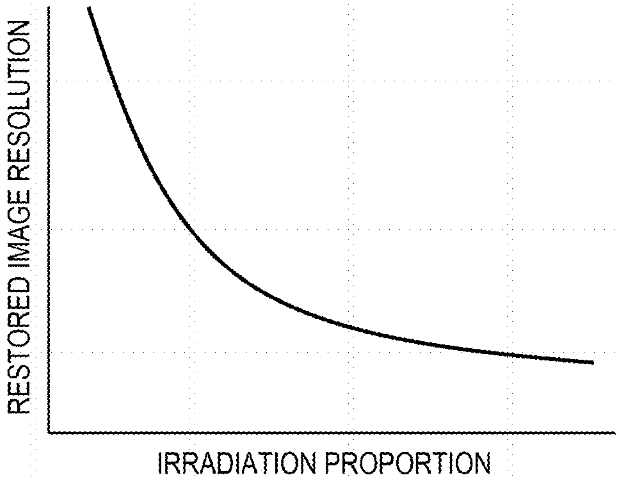

[FIG. 6]
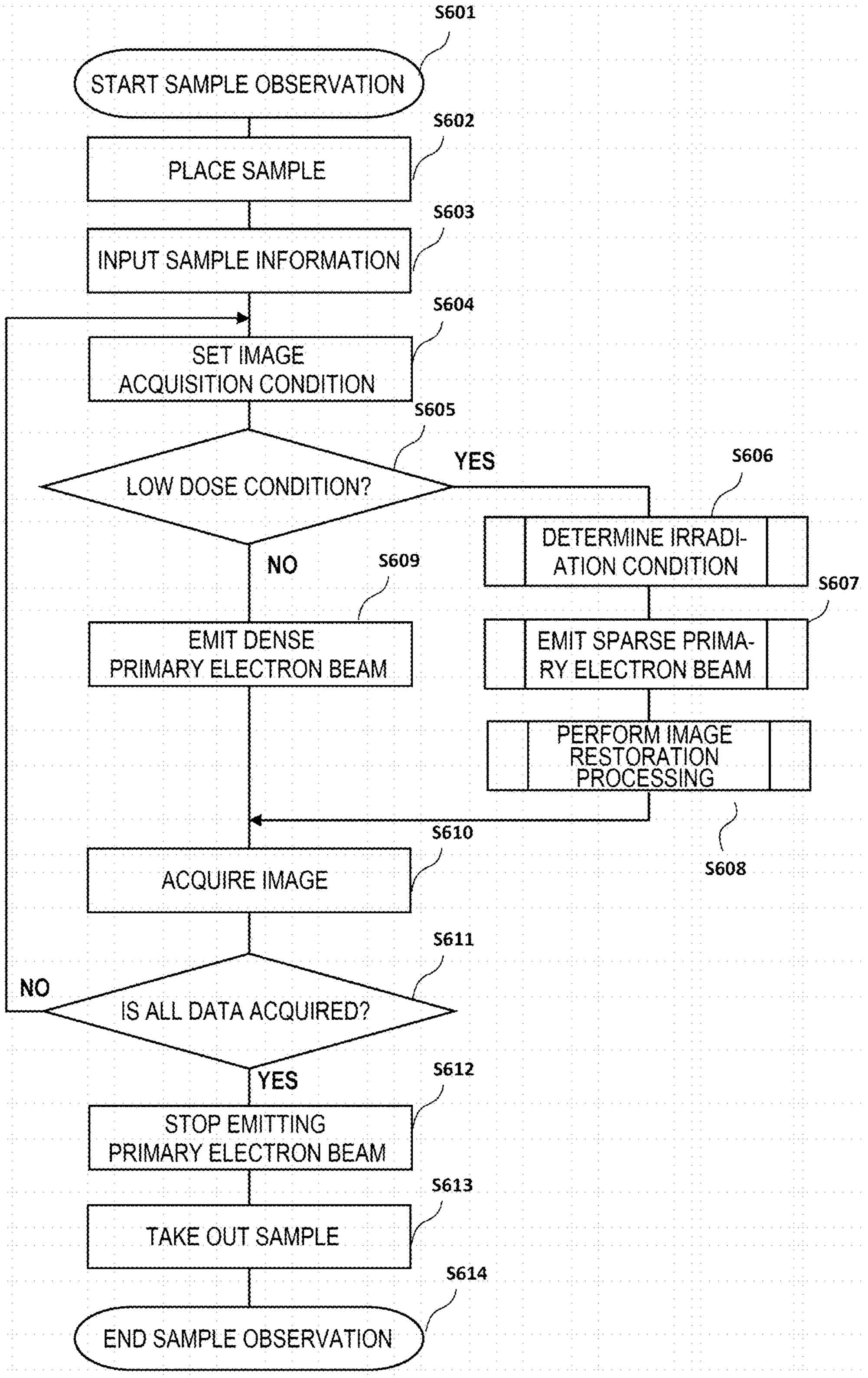

[FIG. 7]
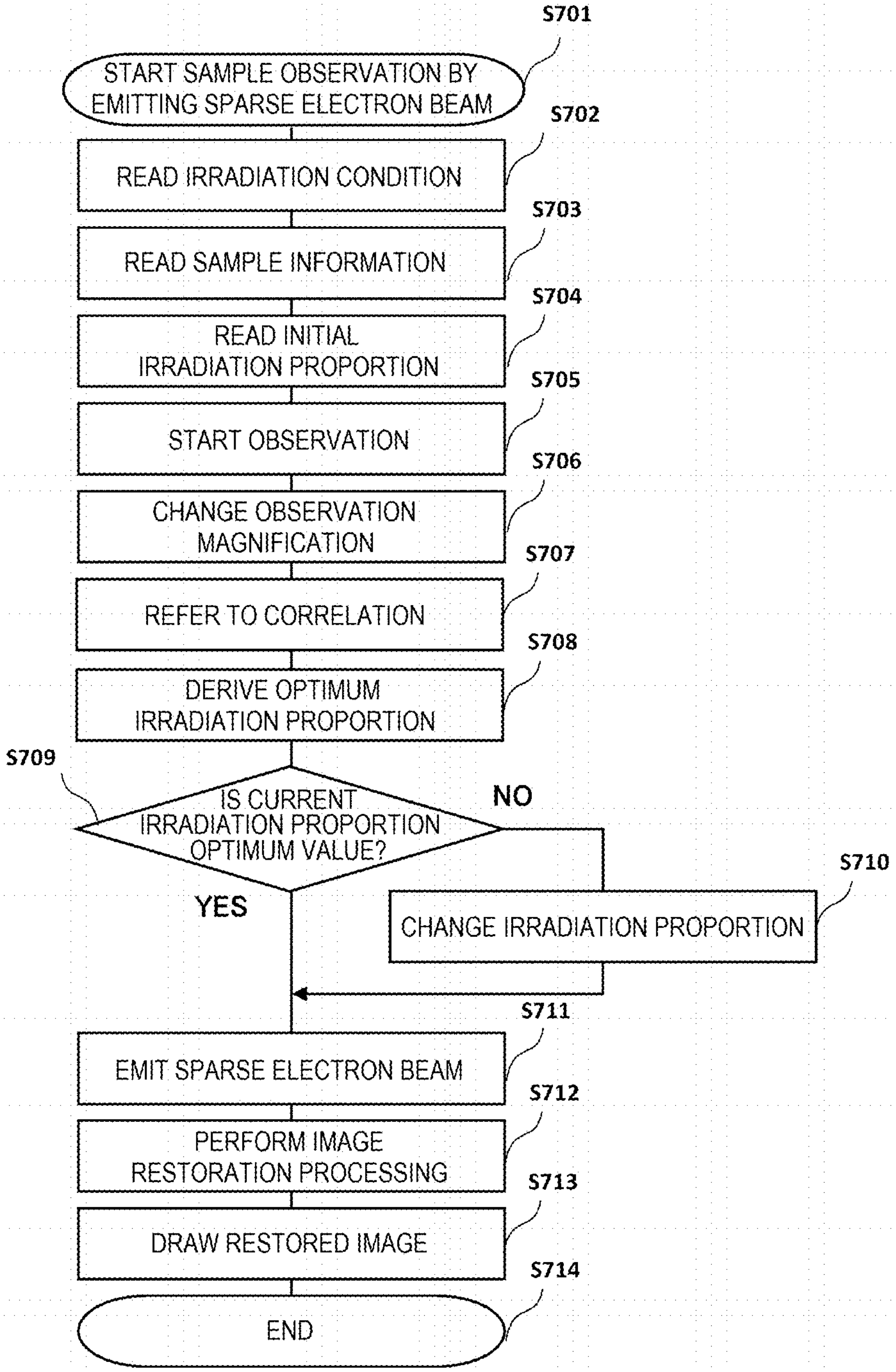

[FIG. 8]
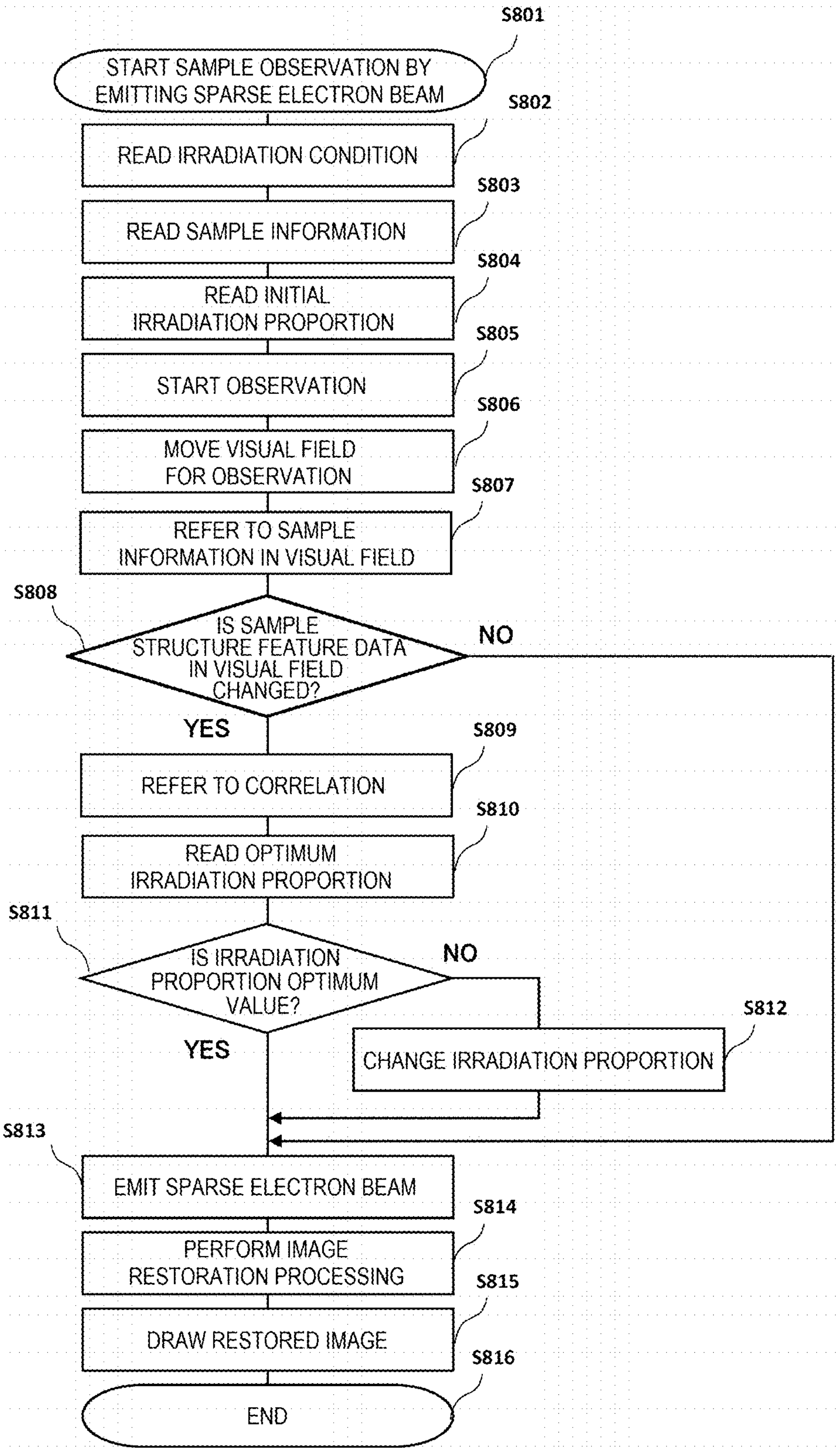

[FIG. 9]
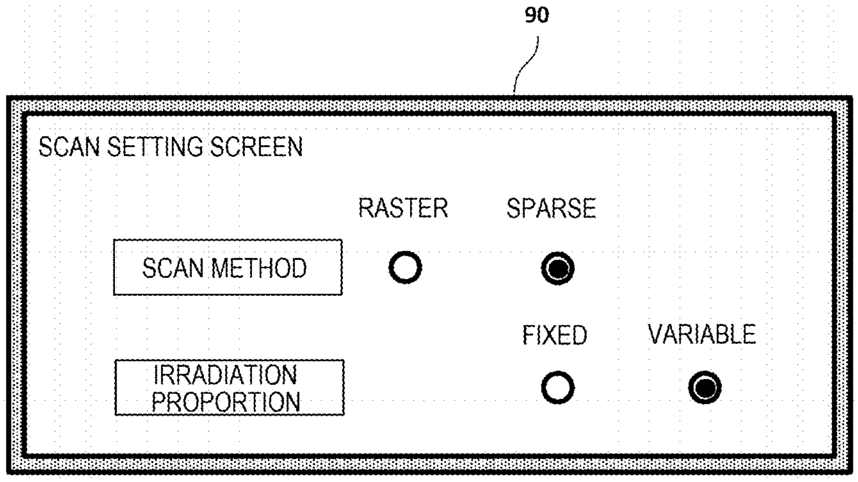
[FIG. 10]
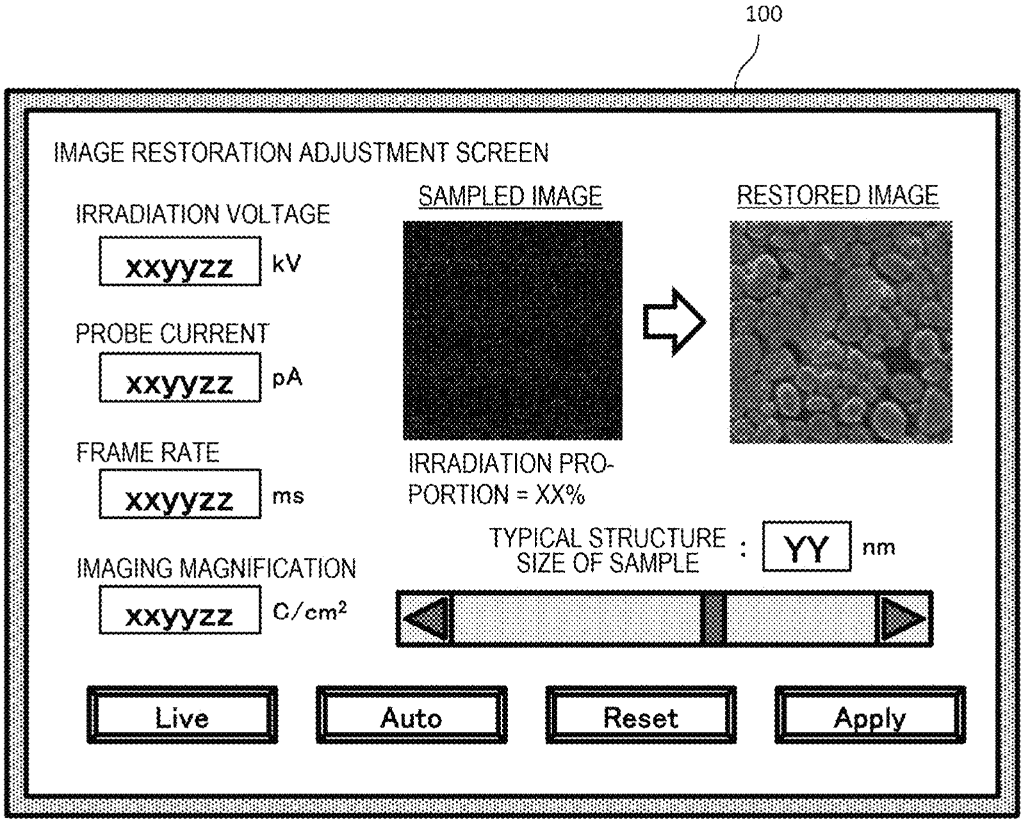

[FIG. 11]
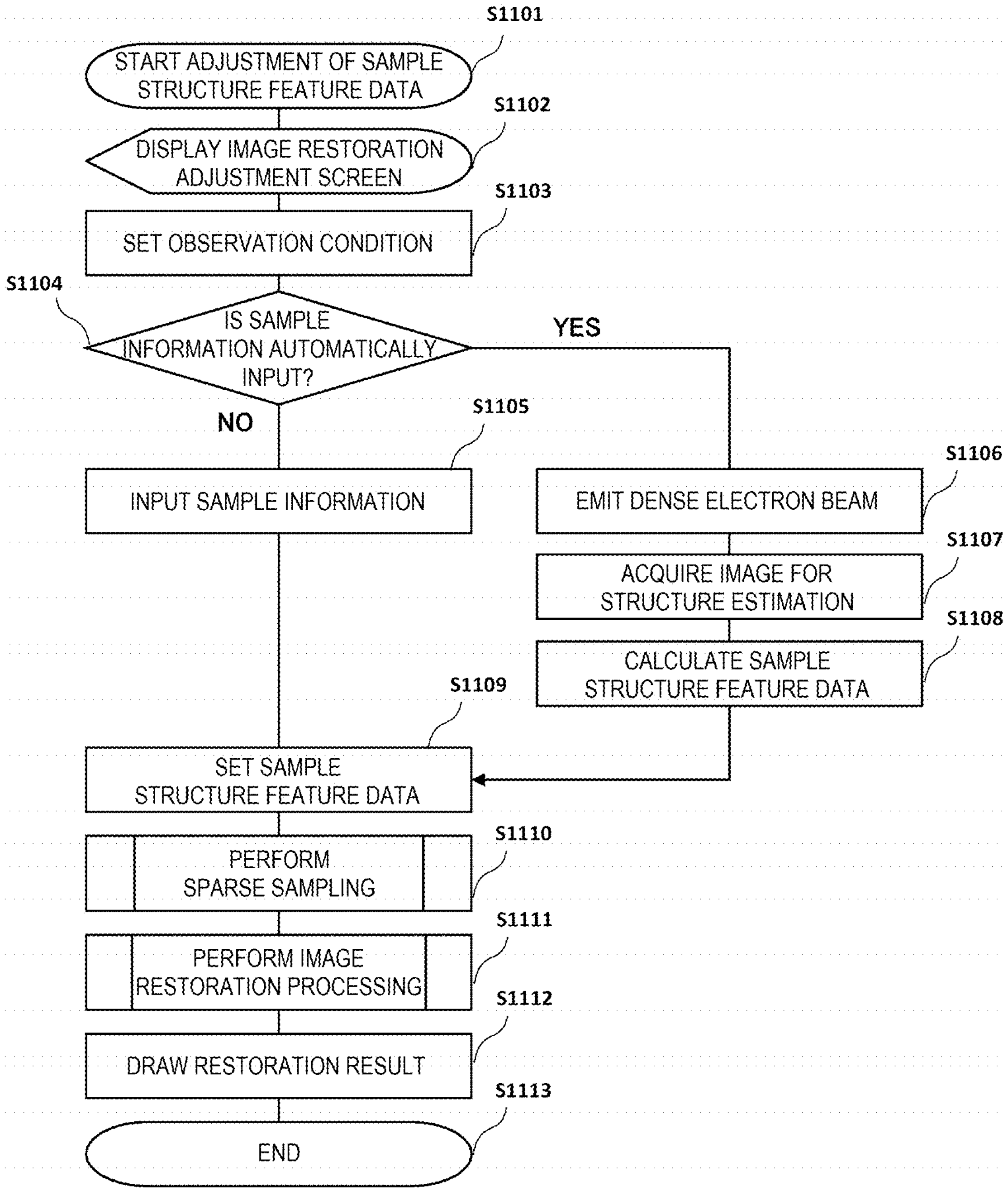

[FIG. 12]
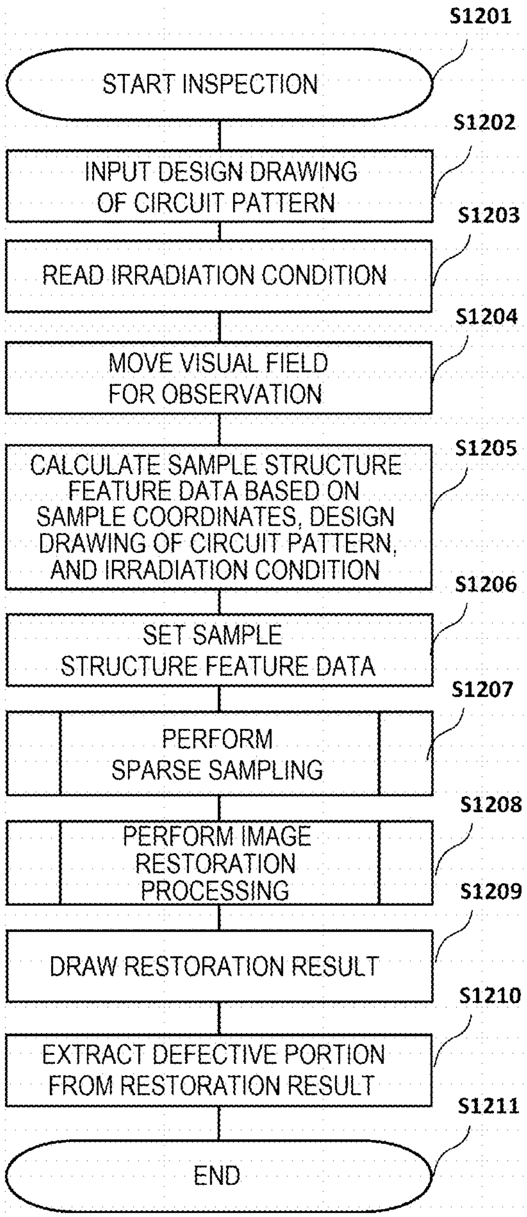

SAMPLE IMAGE OBSERVATION DEVICE AND METHOD

TECHNICAL FIELD

The present invention relates to a sample image observation device and a method, and particularly to a sample image observation technique of implementing low-damage observation.

BACKGROUND ART

A scanning electron microscope (SEM) detects signal electrons generated when a converged probe electron beam irradiates and scans a sample, and displays a signal intensity at each irradiation position in synchronization with a scanning signal of the electron beam for irradiation, thereby obtaining a two-dimensional image of a scanning area on the sample surface.

In recent years, with spreading to soft materials such as a biological sample to be observed by the SEM and miniaturization of semiconductor devices to be inspected, there is an increasing observation need for reducing sample damage caused by electron beam irradiation during SEM observation. On the other hand, as a method for implementing low-damage observation in the SEM, there is a method for restoring original information by computer processing based on a sparsely sampled image, which is obtained by applying a concept of compressed sensing (CS) and irradiating only a limited point of a sample with an electron beam. As a result, as compared with an observation method in which an entire surface of the sample is scanned with the electron beam in the related art, a dose amount for the sample can be reduced and overall damage can be reduced.

As a related-art literature related to such a sample image observation technique, for example, PTL 1 discloses acquisition of a sparsely sampled image and image restoration in an SEM. In particular, PTL 1 discloses a method for mitigating an influence of a response delay of a deflector for a primary electron beam by sampling only adjacent pixels according to a scan method, as a method for acquiring the sparsely sampled image, for performing random hopping on a line.

CITATION LIST

Patent Literature

PTL 1: JP2019-525408A

SUMMARY OF INVENTION

Technical Problem

In the restoration based on the sparsely sampled image, an image quality of a restored image, in particular, a spatial resolution greatly changes depending on an irradiation proportion with respect to an entire visual field which is an observation area. Here, the irradiation proportion is defined as a ratio of the number of pixels irradiated with the electron beam to the number of pixels corresponding to the entire visual field when a digital image is acquired in a certain visual field. That is, in a general scanning image in the SEM, since all pixels in the image are densely irradiated with the electron beam, an image of a 100% irradiation area is acquired. A main reason for a change in restored image quality with respect to the irradiation proportion is that an average distance between irradiation points changes depending on the irradiation proportion. Since the restoration based on the sparsely sampled image is synonymous with restoration based on spatially thinned information, a substantial resolution depends on the average distance between the irradiation points.

The image quality required for sample observation in the SEM varies depending on observation magnification or a structure size of a target sample included in a visual field for observation. That is, when a specific sample structure is observed, it means that, in a single irradiation proportion, observation with a reduced dose amount based on sufficient image quality is performed only at limited observation magnification or in a limited visual field.

Generally, in the SEM observation, first, after an image acquisition condition such as determination of an acceleration voltage appropriate for observation and adjustment of a probe current is set, the observation is started. When the observation is started, a series of operations are usually continuously performed, including first searching for a visual field, followed by detailed observation of a region of interest, and subsequent imaging. During the observation, the observation magnification is frequently changed, or the visual field is frequently moved.

In a series of observation actions, it is basically required to perform seamless observation without changing the image acquisition condition related to a primary electron beam. This is because, when the image acquisition condition is changed, it is necessary to perform focus adjustment, astigmatism correction, and the like one by one, and observation throughput and usability are severely impaired. These requirements are also the same when using an observation method that uses the restoration based on the sparsely sampled image described above.

However, for example, in the technique disclosed in PTL 1, the irradiation proportion or an irradiation pattern of the electron beam is not changed basically during a series of observations. Therefore, when an observation condition is changed, for example, the magnification is changed or the visual field is moved, it may be difficult to acquire a restored image having a sufficient resolution for observing a structure of a target sample.

An object of the invention is to provide a sample image observation device and a method that restore an image based on a sparsely sampled image and that can improve observation throughput and usability by solving the problems in the sample image observation technique described above and maintaining a restored image quality constant regardless of a change in an observation condition.

Solution to Problem

In order to solve the above problems, for example, a configuration described in the claims is adopted. The present application includes a plurality of units for solving the above problems, and provides, as an example thereof, a sample image observation device that irradiates a part of an observation area of a sample with an electron beam and restores an image including a pixel not irradiated with the electron beam. The sample image observation device includes: a storage unit configured to store a correlation between an irradiation condition of irradiating the observation area of the sample with the electron beam and an observation condition of the sample; and a control unit configured to synchronize the irradiation condition of the electron beam with the observation condition based on the correlation.

In addition, the invention provides a sample image observation method using a sample image observation device that irradiates a part of an observation area of a sample with an electron beam and restores an image including a pixel not irradiated with the electron beam. The sample image observation device includes a storage unit configured to store a correlation between an irradiation condition of irradiating the observation area of the sample with the electron beam and an observation condition of the sample, and a control unit configured to synchronize the irradiation condition of the electron beam with the observation condition based on the correlation. The irradiation condition is determined based on a structure size of the sample.

Advantageous Effects of Invention

According to the invention, in the sample image observation device that obtains a restored image based on the sparsely sampled image, the restored image quality can be maintained constant regardless of a change in the observation condition, and an effect of improving the observation throughput and the usability can be attained.

Additional features related to the invention will become apparent from the description of the present specification and the accompanying drawings. Problems, configurations, and effects other than those described above will be apparent according to description of the following embodiments.

BRIEF DESCRIPTION OF DRAWINGS

FIG. 1 is a diagram illustrating a configuration example of a sample image observation device according to a first embodiment.

FIG. 2 is a diagram illustrating main parts of a control system of the sample image observation device according to the first embodiment.

FIG. 3 is a diagram illustrating an example of a correlation between observation magnification and an irradiation proportion according to the first embodiment.

FIG. 4 is a diagram illustrating an example of the correlation between the observation magnification and the irradiation proportion according to the first embodiment.

FIG. 5 is a diagram illustrating an example of a correlation between an irradiation proportion and a restored image resolution according to the first embodiment.

FIG. 6 is a diagram illustrating an example of a sample observation flow performed by the sample image observation device according to the first embodiment.

FIG. 7 is a diagram illustrating an example of a flow of sparse sampling and restoration processing performed by the sample image observation device according to the first embodiment.

FIG. 8 is a diagram illustrating an example of the flow of sparse sampling and restoration processing performed by the sample image observation device according to the first embodiment.

FIG. 9 is a diagram illustrating an example of a scan setting screen of the sample image observation device according to the first embodiment.

FIG. 10 is a diagram illustrating an example of an image restoration adjustment screen of the sample image observation device according to the first embodiment.

FIG. 11 is a diagram illustrating an example of a flow of restoration condition adjustment processing performed by the sample image observation device according to the first embodiment.

FIG. 12 is a diagram illustrating an example of a processing flow according to a second embodiment.

DESCRIPTION OF EMBODIMENTS

Hereinafter, embodiments of the invention will be described with reference to the accompanying drawings. Although the accompanying drawings illustrate specific embodiments in accordance with principles of the invention, these embodiments are provided for understanding the invention and are not to be used for limitedly interpreting the invention. In all the drawings for illustrating the embodiments and modifications, components having the same functions are denoted by the same reference numerals, and repeated description thereof is omitted.

First Embodiment

A first embodiment provides a sample image observation device that irradiates a part of an observation area of a sample with an electron beam and restores an image including a pixel not irradiated with the electron beam, and that includes a storage unit configured to store a correlation between an irradiation position as an irradiation condition of irradiating the observation area of the sample with the electron beam and an observation condition of the sample, and a control unit configured to synchronize the irradiation condition of the electron beam with the observation condition based on the correlation; and provides a sample image observation method using a sample image observation device that irradiates a part of an observation area of a sample with an electron beam and restores an image including a pixel not irradiated with the electron beam, the sample image observation device including a storage unit configured to store a correlation between an irradiation condition of irradiating the observation area of the sample with the electron beam and an observation condition of the sample, and a control unit configured to synchronize the irradiation condition of the electron beam with the observation condition based on the correlation, in which the irradiation condition is determined based on a structure size of the sample.

FIG. 1 illustrates a configuration example of the sample image observation device according to the present embodiment. In FIG. 1, a probe electron beam, which is a primary electron beam from an electron gun 11 installed inside a scanning electron microscope body (SEM column) 10, passes through a condenser lens 12 and an aperture 13, is deflected by a scan deflector 14, passes through an objective lens 16, and scans a surface of a sample 19 on a stage 18. Signal electrons, which are secondary electrons generated from the sample 19, are detected by a detector 20, and a detection signal thereof is sent to a control system 22 to restore an image of the surface of the sample 19. The SEM column may include other components such as a lens, an electrode, and a detector in addition to the above-described components, and is not limited to the above-described configuration.

FIG. 2 is a diagram illustrating main parts of a functional configuration of the control system 22 which is a control unit of the sample image observation device according to the first embodiment. The control system may be implemented using, for example, a general-purpose computer, or may be implemented as a function of a program executed on the computer. The computer at least includes a processor such as a central processing unit (CPU), a storage unit such as a memory, and a storage device such as a hard disk. Processing of the control unit may be stored in the memory as program codes, and may be implemented by the processor executing each of the program codes. A part of the control unit may be implemented by hardware such as a dedicated circuit board.

As illustrated in FIG. 2, the control system 22 includes a control device 210, a calculation device 220, and a drawing device 230 that are connected to a bus 240. The control device 210 includes a main control unit 211 that controls the SEM, a beam control unit 212, a scan control unit 213, and a stage control unit 214.

The calculation device 220 includes a path determination unit 221 that determines an irradiation position and a path which are irradiation conditions of the primary electron beam, a correlation storage unit 222, and a restored image estimation unit 223. The correlation storage unit 222 stores a correlation between each observation condition for an observation area of the sample and an irradiation condition related to sparse sampling of the primary electron beam. The path determination unit 223 determines the irradiation position and the path of the electron beam based on the correlation stored in the correlation storage unit. In accordance with the determination, the control device 210 controls the electron beam to obtain a sparsely sampled image. The restored image estimation unit 223 estimates a restored image by computer processing based on the sparsely sampled image.

The drawing device 230 includes a restored image output unit 231 and a scanned image output unit 232, and sequentially performs drawing using the restored image estimated by the restored image estimation unit 223. Output of the restored image estimation unit 223 and the scanned image output unit 232 is sent to a display unit of an input and output terminal 21.

Here, the correlation stored in the correlation storage unit 222 may be, for example, a correspondence relationship between observation magnification and an irradiation proportion. Further, it is preferable to store, in the correlation storage unit 222, a dependency relationship in combination with information on a sample to be observed. The information on the sample to be observed in this case uses an amount related to a characteristic structure size, position distribution, or frequency distribution of the sample. The structure size means a size of a structure of the sample, for example, an interval between adjacent structures, a line width, a thickness of a layer, and a size of a particle diameter or the like. The structure size or a minimum value or an average value of distribution, a statistical variance, or the like may be used, or feature data obtained by a calculation combining these values may be used. In particular, information such as sample structure feature data for a structure present in a visual field during imaging is important.

The correlation stored in the correlation storage unit 222 is predetermined based on, for example, sample information. Alternatively, the correlation derived by computer processing after the sample information is input may be stored in the correlation storage unit 222 and used.

FIG. 3 is a schematic diagram illustrating an example of a correlation between the observation magnification and the irradiation proportion as an example of the correlation stored in the correlation storage unit 222. In order to prevent a change in a restored image quality due to the observation magnification, a relationship is used in which the irradiation proportion decreases as the observation magnification increases and the irradiation proportion increases as the observation magnification decreases. In addition, the correlation is described in a manner of including dependency on the structure of the sample to be observed in the visual field. For example, when a structure size of an observation target in the visual field decreases due to sample replacement or visual field movement, the correlation changes from a curve A to a curve B in FIG. 3. Accordingly, it is possible to observe the sample in a restored image quality corresponding to the sample.

The correlation to be referred to may be a discretized stepwise correlation as exemplified by a solid line in FIG. 4 instead of a continuous curve as exemplified in FIG. 3. When the irradiation proportion is determined by referring to the recorded continuous correlation, discretization transformation may be performed at any step width and used.

The correlation stored in the correlation storage unit may be a correspondence relationship between an irradiation proportion and a restored image resolution. FIG. 5 is a schematic diagram illustrating an example of a correlation between an irradiation proportion and a restored image resolution at specific observation magnification. By deriving and storing the correlation between the irradiation proportion and the restored image resolution in advance, it is possible to determine the irradiation proportion corresponding to the resolution necessary for observation. The correlation between the irradiation proportion and the restored image resolution may be analytically derived from, for example, statistics related to spatial distribution of irradiation points, or may be estimated based on, for example, an actual restored image obtained by an experiment of acquiring a sparsely sampled image in each irradiation proportion.

These correlations are stored in the correlation storage unit 222 and referred to by the path determination unit 221. The path determination unit 221 sequentially checks, with the correlation, the observation magnification and the sample information input via the input and output terminal 21, and dynamically determines the irradiation position and the path of the electron beam. At this time, the sample information may be input by using the sample structure feature data as a direct numerical value or by utilizing design data of the observation target. An image analysis may be performed on an image which is a reference, and the feature data may be extracted and input.

When the sparse sampling is performed, the irradiation position of the primary electron beam is moved using, for example, the scan deflector 14. The scan deflector 14 may be a magnetic-field type using an electromagnetic coil or an electric-field type using electrodes. A deflector used for sparse sampling may be used in addition to the scan deflector 14 used for common raster scan. Further, control may be performed by using a blanker 15 such that the sample is not irradiated with the primary electron beam during a movement between the irradiation points. It is possible to reduce sample damage and prevent detection of signal electrons from positions other than a predetermined irradiation position.

FIG. 6 illustrates an example of a sample observation flow performed by the sample image observation device according to the present embodiment. In FIG. 6, when sample observation is started (S601), a sample is placed on the stage 18 (S602), sample information is input (S603), and an image acquisition condition is set (S604). Then, by checking whether the condition is a low-dose condition (S605), when the condition is the low-dose condition (YES), an irradiation condition such as the irradiation proportion, the irradiation position, or a movement path of the primary electron beam is determined (S606). A sparse primary electron beam is emitted according to the determined irradiation condition (S607), and an image is generated by performing image restoration processing based on a detection signal (S608).

On the other hand, when the condition is not the low-dose condition (NO), a dense primary electron beam is emitted (S609), and an image is generated based on the detection signal. The emitting of the electron beam and image acquisition are repeated based on a change in the image acquisition condition (S610) to check whether all data is acquired (S611), and when all data is acquired (YES), the emitting of the primary electron beam is stopped (S612), the sample is taken out (S613), and the sample observation ends (S614).

FIG. 7 illustrates an example of a flow of sparse sampling and restoration processing according to the present embodiment. In FIG. 7, when the sparse sampling and restoration processing is started (S701), an irradiation condition is read (S702), then sample information input from a sample information input unit is read (S703), and subsequently an initial irradiation proportion is read (S704). When the observation is started (S705) and observation magnification is set and changed (S706), a correlation between the observation magnification and the irradiation proportion, which is recorded in the correlation recording unit 222, is referred to (S707). Based on the already read sample information, an optimum irradiation proportion is derived from the correlation that is referred to (S708).

Then, the current irradiation proportion is compared with a derived optimum value (S709), and when the current irradiation proportion is different from the optimum value (NO), the irradiation proportion is changed (S710). On the other hand, when the current irradiation proportion is the optimum value (YES), the irradiation proportion is not changed. The irradiation position or the movement path is determined based on the determined irradiation proportion, a sparse primary electron beam is emitted (S711), an image is generated by performing image restoration processing based on a detection signal (S712), and a restored image is drawn by the drawing device 230 (S713).

It is desirable that the irradiation proportion is changed immediately in conjunction with the change of the observation magnification in a sequential manner. However, it is not necessary to change the irradiation proportion and the observation magnification strictly simultaneously, for example, the irradiation proportion may be changed for each frame rate as a drawing time of an image, or may be changed at a time interval during a drawing time of a unit block when the image is drawn in units of blocks instead of an entire image.

For example, a concept of compressed sensing may be used for the image restoration processing based on the emitting of the sparse primary electron beam. In this case, processing using a rule-based algorithm may be performed, processing using a training-type algorithm may be performed, or a plurality of combinations thereof may be performed. These restoration algorithms may be selected and used, for example, from a viewpoint of processing time or restored image quality.

FIG. 8 illustrates an example of a modification of the flow of the sparse sampling and restoration processing performed by the sample image observation device according to the present embodiment. In FIG. 8, when the sparse sampling and restoration processing are started (S801), an irradiation condition is read (S802), then sample information that is input is read (S803), and subsequently a preset initial irradiation proportion is read (S804).

When observation is started (S805) and a visual field for observation is set and changed (S806), first, sample information corresponding to a position of the visual field for observation is referred to based on the already read sample information (S807) and sample structure feature data in the visual field is determined. Then, sample structure feature data before and after a movement of the visual field are compared (S808), and when the sample structure feature data is changed (YES), a correlation between observation magnification and the irradiation proportion recorded in the correlation recording unit is referred to (S809). Based on the sample structure feature data after the movement of the visual field and current observation magnification, an optimum irradiation proportion is derived from the correlation that is referred to (S810). Then, the current irradiation proportion is compared with a derived optimum value (S811), and when the current irradiation proportion is different from the optimum value (NO), the irradiation proportion is changed (S812).

On the other hand, when the current irradiation proportion is the optimum value (YES), the irradiation proportion is not changed. An irradiation position or a movement path is determined by the path determination unit 221 based on the determined irradiation proportion, a sparse primary electron beam is emitted based on the determination (S813), an image is generated by performing image restoration processing based on a detection signal (S814), and a restored image is drawn (S815). When the sample structure feature data in the visual field before and after the movement of the visual field does not change (No in S808), the irradiation proportion is also not changed.

FIG. 9 is a diagram illustrating an example of a scan setting screen of the sample image observation device in the present embodiment. As illustrated in FIG. 9, by using a scan setting screen 90 displayed on the display unit of the input and output terminal 20, a user can select either "raster" as a dense scan for scanning an entire visual field, or "sparse" as a sparse scan for irradiating only a specific pixel with an electron beam, both of which are scan methods. In addition, in a sparse scan mode, it is possible to select a variable mode in which the irradiation proportion is dynamically changed and controlled according to a change in the observation condition, and a fixed mode in which the irradiation proportion is maintained at a constant value.

FIGS. 10 and 11 are diagrams illustrating restoration condition adjustment processing in the present embodiment. FIG. 10 illustrates an example of an image restoration adjustment screen, and FIG. 11 illustrates an example of a flow of restoration condition adjustment processing.

In the image restoration adjustment screen of FIG. 10, an irradiation voltage, a probe current, a frame rate, and imaging magnification that are observation condition parameters can be set. The image restoration adjustment screen can display a sparsely sampled image, an irradiation proportion thereof, and a restored image. Further, a typical sample size can be input as the sample information input unit, and can be changed not only by directly inputting a numerical value but also by moving a slider.

In the flow of restoration condition adjustment processing illustrated in FIG. 11, when the restoration condition adjustment processing is started (S1101), an image restoration adjustment screen 100 is displayed on the display unit of the input and output terminal 20 connected to the control system 21 (S1102), and the adjustment is started. Then, first, an observation condition is set (S1103) using the screen. Then, it is checked whether sample information is automatically input (S1104). When the sample information is not automatically input (NO), the user manually inputs the sample information to the adjustment screen (S1105). Here, as the sample information, an amount related to a characteristic structure size, position distribution, or frequency distribution is input. For example, in the adjustment screen illustrated in FIG. 10, a typical size of sample corresponds to the sample information. A parameter is set as sample structure feature data based on the input sample information (S1109).

On the other hand, when the sample information is automatically input (YES), the sample is irradiated with a dense electron beam (S1106), and an image for sample structure estimation is acquired based on a detection signal (S1107). Then, the sample structure feature data is calculated by the computer processing performed on the acquired image (S1108), and a parameter is set (S1109). Here, the image for sample structure estimation may be an image acquired under a single observation condition, or may be a combination of images acquired in a plurality of visual fields or at a plurality of observation magnifications.

Then, the sparse sampling is performed based on the set parameter (S1110), the image restoration processing is performed (S1111), a restoration result is drawn (S1112), and the restoration condition adjustment processing ends (S1113). The user views the drawn restored image, and confirms that the restored image has a desirable image quality. Further, when it is necessary to perform the adjustment, the parameter is adjusted to repeat the present adjustment flow. At this time, it is desirable that the sparse sampling and the irradiation proportion before restoration are displayed together on the display unit of the screen. Accordingly, the user can grasp a state of irradiating the sample with the electron beam.

According to the sample image observation device and the sample image observation method in the first embodiment described above, it is possible to perform high-accuracy observation and analysis in which the sample damage is prevented with an image quality according to the structure of the sample to be observed regardless of observation conditions.

Second Embodiment

A second embodiment is an embodiment in which the sample image observation device described in the first embodiment is applied particularly to inspection and measurement of a semiconductor circuit pattern. In the inspection and measurement of the semiconductor circuit pattern, a method (Die to Database) of referring to a sample image and a design drawing of a circuit pattern at coordinates at which the image is acquired and specifying a defect position of the semiconductor circuit pattern based on a difference between the sample image and the design drawing is widely used. In the present embodiment, a method of applying a flow of sparse sampling and restoration processing to the Die to Database will be described.

FIG. 12 illustrates an example of a processing flow in the present embodiment. When inspection is started (S1201), a design drawing of a circuit pattern to be observed is input from the input and output terminal 21 connected to the control system 22 (S1202). The input design drawing of the circuit pattern is recorded in a circuit pattern recording unit (not illustrated) attached to the calculation device 220. Next, irradiation conditions such as an irradiation voltage, a probe current, a frame rate, and observation magnification are read (S1203). Next, the stage 18 is moved to coordinates to be observed, and the coordinates after the movement are read (S1204). Then, a structure of a sample to be observed is calculated based on the coordinates in a sample image observation device and the design drawing of the semiconductor circuit pattern.

That is, the circuit pattern at the coordinates in the design drawing of the circuit pattern is referred to, a pattern size included in the visual field under the irradiation conditions is extracted from the circuit pattern, and sample structure feature data is calculated (S1205). Then, the calculated sample structure feature data is set (S1206), sparse sampling is performed (S1207), image restoration processing (S1208) is performed, and a restoration result is drawn (S1209). Finally, it is determined whether a defective portion is present in the semiconductor circuit pattern using the drawn restoration result (S1210), and the processing ends (S1211). Additionally, the design drawing of the semiconductor circuit pattern that is referred to in the present embodiment is not limited to the design drawing. For example, an arrangement drawing or a layout of the circuit pattern may be referred to, or a simulated observation image generated based on layout and design information on these patterns may be referred to. A sample observation image including a target area of a sample or a sample observation image having the same or higher irradiation proportion may be referred to, or a plurality of sample observation images acquired under a plurality of irradiation conditions may be referred to.

According to the sample image observation device and the method described above, it is possible to shorten an electron beam irradiation time and achieve image quality of a sample image simultaneously. Although an application of the Die-to-Database is described in the present embodiment, the invention is not limited thereto and can be applied in various forms to accurately measure a semiconductor pattern.

The invention is not limited to the embodiments described above, and includes various modifications. For example, the above embodiments are described in detail for a better understanding of the invention, and the invention is not necessarily limited to those including all the configurations described above.

REFERENCE SIGNS LIST

10: SEM column
11: electron source
12: condenser lens
13: aperture
14: scan deflector
15: blanker
16: objective lens
17: sample chamber
18: stage
19: sample
20: detector
21: input and output terminal
22: control system
210: control device
220: calculation device
230: drawing device
240: bus

The invention claimed is:

1. A sample image observation device that irradiates a part of an observation area of a sample with an electron beam and restores an image including a pixel not irradiated with the electron beam, the sample image observation device comprising:

a storage unit configured to store a correlation between an irradiation condition of irradiating the observation area of the sample with the electron beam and an observation condition of the sample, the observation condition comprising at least one of observation magnification and a visual field for observation; and a control unit configured to synchronize the irradiation condition with the observation condition based on the correlation.

2. The sample image observation device according to claim 1, further comprising:

an input unit configured to input sample information.

3. The sample image observation device according to claim 2, wherein the irradiation condition is determined based on a structure size of the sample.

4. The sample image observation device according to claim 3, wherein the observation condition is observation magnification.

5. The sample image observation device according to claim 3, wherein the observation condition is a visual field for observation.

6. The sample image observation device according to claim 4, wherein the irradiation condition is an irradiation proportion as a ratio of a pixel irradiated with the electron beam to all pixels in the image.

7. The sample image observation device according to claim 4, wherein the irradiation condition is a movement path of a pixel irradiated with the electron beam in the image.

8. The sample image observation device according to claim 6, further comprising:

a display unit configured to display an irradiation proportion of the electron beam, an irradiation position, or an average dose amount.

9. The sample image observation device according to claim 2, wherein the sample is a semiconductor circuit pattern, and the sample information input from the input unit is design information on the semiconductor circuit pattern.

10. The sample image observation device according to claim 9, wherein a structure of the sample is calculated based on coordinates of the sample in the sample image observation device and design information on the semiconductor circuit pattern, and an irradiation proportion of the electron beam is determined based on the structure of the sample and the observation condition.

11. A sample image observation method using a sample image observation device that irradiates a part of an observation area of a sample with an electron beam and restores an image including a pixel not irradiated with the electron beam, the sample image observation device including a storage unit configured to store a correlation between an irradiation condition of irradiating the observation area of the sample with the electron beam and an observation condition of the sample, and a control unit configured to synchronize the irradiation condition of the electron beam with the observation condition based on the correlation, wherein the irradiation condition is determined based on a structure size of the sample, and wherein the observation condition comprises at least one of observation magnification and a visual field for observation.

12. The sample image observation method according to claim 11, wherein the observation condition is observation magnification or a visual field for observation.

13. The sample image observation method according to claim 12, wherein the irradiation condition is an irradiation proportion as a ratio of a pixel irradiated with the electron beam to all pixels in the image.

14. The sample image observation method according to claim 12, wherein the irradiation condition is a movement path of a pixel irradiated with the electron beam in the image.

15. The sample image observation method according to claim 12, wherein the sample image observation device includes a display unit, and the display unit displays an irradiation proportion of the electron beam, an irradiation position, or an average dose amount.

* * * * *